(12) United States Patent
Patenaud et al.

(10) Patent No.: US 7,340,375 B1
(45) Date of Patent: Mar. 4, 2008

(54) METHOD AND APPARATUS FOR NOISE FLOOR ESTIMATION

(75) Inventors: Francois Patenaud, Hull (CA); Martial Dufour, Aylmer (CA)

(73) Assignee: Her Majesty the Queen in right of Canada, as represented by the Minister of Industry Through the Communications Research Centre, Ottawa, Ontario (CA)

( * ) Notice: Subject to any disclaimer, the term of this patent is extended or adjusted under 35 U.S.C. 154(b) by 0 days.

(21) Appl. No.: 09/503,834

(22) Filed: Feb. 15, 2000

(30) Foreign Application Priority Data

Feb. 15, 1999 (CA) ................................. 2260336

(51) Int. Cl.
*G06F 19/00* (2006.01)
(52) U.S. Cl. ..................................... 702/180
(58) Field of Classification Search ............. 702/180, 702/76, 77, 69; 324/76.23, 76.21, 76.27, 324/76.26; 375/308, 141, 227, 316, 132
See application file for complete search history.

(56) References Cited

U.S. PATENT DOCUMENTS

| | | | | | |
|---|---|---|---|---|---|
| 5,172,064 | A | * | 12/1992 | Walls | 324/601 |
| 5,381,150 | A | * | 1/1995 | Hawkins et al. | 342/13 |
| 5,465,097 | A | * | 11/1995 | Fry | 342/442 |
| 5,583,505 | A | * | 12/1996 | Andersen et al. | 342/13 |
| 5,696,691 | A | * | 12/1997 | Schlosser et al. | 702/77 |
| 5,748,507 | A | * | 5/1998 | Abatzoglou et al. | 702/76 |
| 5,752,164 | A | * | 5/1998 | Jones | 455/454 |
| 5,764,694 | A | * | 6/1998 | Rahamim et al. | 375/224 |
| 5,969,834 | A | * | 10/1999 | Farber et al. | 359/110 |
| 6,122,309 | A | * | 9/2000 | Bergstrom et al. | 375/130 |
| 6,131,013 | A | * | 10/2000 | Bergstrom et al. | 455/63 |
| 6,142,943 | A | * | 11/2000 | Mo et al. | 600/447 |
| 6,212,229 | B1 | * | 4/2001 | Salinger | 375/224 |
| 6,240,282 | B1 | * | 5/2001 | Kleider et al. | 455/226.1 |
| 6,266,633 | B1 | * | 7/2001 | Higgins et al. | 704/224 |
| 6,269,161 | B1 | * | 7/2001 | McLaughlin et al. | 379/406 |

OTHER PUBLICATIONS

"Automatic Noise Floor Spectrum Estimation in the Presence of Signals", M. J. Ready, M. L. Downey, and L. J. Corbalis, *Proceedings of the 31st Asilomar Conference on Signals, Systems and Computers*, vol. 1, pp. 877-881, Nov. 1997.
"Noise Floor Estimation for Wide-Band FFT Filter Banks".
"Mobile Communications Engineering", W. C. Y. Lee, McGraw-Hill, pp. 62-72; 180-183, 1982.
"Detection of Signals by Information Theoretic Criteria", M. Wax and T. Kailath, IEEE Transactions Acoustic, Speech, Signal Processing, vol. 33, No. 2, pp. 387-392, Apr. 1985.

* cited by examiner

*Primary Examiner*—Bryan Bui
(74) *Attorney, Agent, or Firm*—Anne Kinsman; Borden Ladner Gervais LLP

(57) ABSTRACT

A method and device are provided for an improved system and method of estimating the noise floor of a wideband signal without full knowledge of the nature of the narrowband signals contained therein, and provides digital characteristics to allow real-time signal processing with low levels of computational complexity. The method and device require very little a priori knowledge of the nature of the signals, allow both robust performance in non-ideal environments, and automated maximum sensitivity threshold setting.

37 Claims, 10 Drawing Sheets

METHOD AND APPARATUS FOR NOISE FLOOR ESTIMATION

FIELD OF THE INVENTION

The invention relates to the field of telecommunications and in particular the signal processing in receivers of communication signals.

BACKGROUND

In the art of telecommunications, it is desirable to estimate the average noise power contained in a received signal. Typically, the received signal is a frequency division multiplexed composite signal containing several distinct signals. It is important to be able to estimate the noise power without a priori knowledge of the number, nature, carrier-frequency, bandwidth or amplitudes of the distant signals.

In the art, noise is considered an additive phenomenon. It distorts a signal by adding random time-varying values to the amplitude of the non-noise component of the signal. It is thus of great importance to develop a radio receiver that is robust to the noise phenomenon.

The general problem of estimating the variance of the additive noise in a communication signal composed of many narrowband frequency division multiplex signals is important in many radio communication systems. It allows setting the detectors threshold to its maximum sensitivity while limiting the probability of a false alarm to a value less than or equal to a desired level. The detector decides that a signal is present when the energy of a signal, over a period of time, exceeds a threshold value. The detected signals can then be passed to a receiver or to measurement equipment, for demodulation or to acquire more information about the signal.

Currently there are several techniques that are used in this pursuit, but all come with sacrifices. One such technique is to reserve a portion of the bandwidth of the composite signal to carry a "noise channel". Thus by measuring the power in this reserved band, an estimate of the noise power in the other channels can be obtained. It is common though for these "noise channels" to be difficult to identify as their placement in the spectrum of the composite signal is not governed by any global convention which leads to different channel assignments based on geographical location of the measurement equipment. Other errors are introduced when the "noise channel" is affected by the signals in adjacent channels. This results in a biased estimation of the noise floor. If the channel assignment is unknown, it may not be possible to identify the "noise channel" and determine the noise floor power level. In addition to these problems the noise floor tends to fluctuate with environmental and operation conditions.

In the art, it is common practice to set a noise threshold value, determined in large part by the estimated noise floor, whereby a signal is considered present if and only if it is above the noise threshold.

The traditional approach is to set a threshold value depending on the user needs. When high sensitivity is required, the threshold is set to a value close to the user observed noise floor level. When only strong signals are of interest, the threshold is set to a high value relative to the observed noise floor level. This approach is highly subjective and may result in being too aggressive or too conservative for the actually measured signal environment. The threshold is typically set manually in a communications system. This is not feasible when fast response to dynamically changing conditions is required. Very few automated techniques have been studied to address the general problem of rapidly and dynamically estimating the noise floor level or the signal-to-noise ratio. One typical method is to isolate a channel and to assign this channel as a noise only channel for estimation purposes. This method is difficult to apply in many new digital communications systems where the resources are often utilized close to their capacity. It is also a problem for dynamic signal environments based on multiple access. Another typical method is to assume that the composite wideband signal non-noise subspace dimension is known. This is again difficult to realize in practical situations with unknown signals where robustness is a key feature. On another front, a technique based on morphological binary image processing operators (similar to rank-order filtering) as described in "Automatic Noise Floor Spectrum Estimation in the Presence of Signals", M. J. Ready, M. L. Downey, and L. J. Corbalis, *Proceedings of the 31$^{st}$ Asilomar Conference on Signals, Systems and Computers*, vol. 1, pp 877-881, November 1997, processes a binary image of the wideband received power spectrum of a composite signal has been proposed. Thus, the approach does not process the time samples or frequency domain transformed data directly, but the instead it processes an image of the spectrum. This involves two dimensional signal processing that is usually complex. Furthermore, practical performances results have yet to be quantified with such an approach. In general, techniques based on textbook results tend to assume several conditions that are not truly present in many bands of the radio spectrum.

The computational complexity of a method is a limiting factor of the method's applicability. Typically, a spectrum monitoring receiver cannot observe the full spectrum it is allotted, thus it divides the spectrum into smaller blocks that can be scanned, each of these blocks possibly contains a plurality of signals. Each block is received sequentially, an estimate of the noise floor is arrived at, and then the receiver shifts its frequency to receive another block. This cycling through the allotted bandwidth must be done rapidly to ensure that all messages being transmitted in the different parts of the allotted spectrum can be received. If the method to derive a noise floor estimate is too complex then it either cannot keep pace with the shifting of the block or it causes the shifting of the blocks to slow down, in the event of either result the method ceases to be useful.

Thus, it would be desirable to design a system that resolves the problems that the above mentioned methods have with narrowband signals of unknown nature, as described in "Noise Floor Estimation for Wide-Band FFT Filter Banks". It would also be desired for a new system to have fully digital characteristics so as to permit real-time signal performance, without requiring the dedication of a reserved frequency band for use as a noise channel.

SUMMARY OF THE INVENTION

It is an object of the invention to remedy numerous problems found in the prior art methods.

It is another object of the invention to provide a noise floor estimation method and apparatus capable of operation on a wideband signal without full knowledge of the nature of the narrowband signals contained therein.

It is another object of the invention to provide digital characteristics to allow real-time signal processing with low levels of computational complexity.

The preferred embodiment of the method of the invention, with very little a priori knowledge of the signals, allows both robust performance in non-ideal environments, and an automated maximum sensitivity threshold setting method. These modifications make the process of the invention an attractive solution to problems emerging in the field of digital communications. As an added benefit, information derived by the method of the invention may be used in spectrum quality indication, interference analysis, and signal demodulation.

In the preferred embodiment of the method in accordance with the present invention, the noise floor is estimated by carrying our the steps of:
  a. representing the continuous signal as a series of discrete frequency and amplitude values;
  b. creating a histogram based on the discrete frequency and amplitude values;
  c. deriving a noise floor estimate from characteristics of the histogram.

The discrete frequency and amplitude values are preferably obtained by the steps of:
  d. sampling a received wideband signal by a plurality of analogue-to-digital converters to generate a series of output signals;
  e. windowing the output signals of the analogue-to-digital converters;
  f. applying a mathematical transform, preferably a Fast Fourier Transform, to the results of the windowing to obtain a series of discrete frequency values;
  g. converting an amplitude of each discrete frequency value to log-domain representation; and
  h. rounding the log-domain representation of the amplitude for each discrete frequency value to the nearest integer value to generate a discrete amplitude value.

The windowing step preferably includes the steps of:
  i. selecting a discrete weighting function;
  j. multiplying the value of each output signal of the series by a corresponding element of the discrete weighting function.

The amplitude of each value of the discrete frequency series is preferably converted to log domain representation by multiplying 20 by the base 10 logarithm of the magnitude of the element; whereby the log domain representation of the amplitudes results in the amplitudes being expressed either as decibel (dB) values, or as decibel milliwatt (dBm) values.

In a first preferred embodiment of the steps of creating and analyzing the histogram to estimate the noise floor, herein referred to as the discrete level crossing rate method, a histogram chart is constructed where the minimum value is equal to the minimum integer value in dB of the received signal strength, and the maximum value is equal to one less than the highest integer value in dB of the received signal strength. Every time a segment of the signal is found to have a positive slope, the histogram bins crossed by the segment are incremented by one. Thus, for example, if a given segment starts at −110 dB and rise to −105 dB in the next sample, the values of the bins representing −110, −109, −108, −107 and −106 dB are incremented by one. After the complete histogram has been assembled, the next step is preferably to determine the location on the dB scale of the noise floor level. Typically, the histogram will be bimodal in the presence of noise and a plurality of signals, with the first true local maximum indicating the noise floor. To find the noise floor, preferably the first local maximum starting from the minimum quantised dB value is selected. Because the histogram is created from sampled data affected by a random source it is possible to have numerous local maxima that do not reflect the true noise floor, as a result it is preferred to check if the local maximum is in fact the noise floor. In the most preferred embodiment, the method for the maximum value found includes the step of checking if a histogram value within Y dB is higher than the current maximum, where Y is a preferred number derived empirically from the characteristics of the system, most preferably between 2 and 3 dB. If the no value in the next Y db is greater than the value at the maximum then the current maximum abscissa is indicative of the noise floor level estimate per bins, however if the value is greater Y db away from the maximum than it is at the maximum then it is clear that the noise floor has not been found. In the event that the maximum is not the noise floor, the next local maximum is preferably used and the Y dB test applied again until the test fails to produce a value higher than the value at the maximum. The obtained abscissa value is finally preferably corrected by a fixed offset of X dB, where X is preferably dependent on the selected window, to give the noise floor level estimate per bin for the processed block of data.

In a second preferred embodiment of the steps of creating and analyzing the histogram to estimate the noise floor, herein referred to as the penalized quasi log-likelihood method, a histogram of quantized frequency domain amplitudes is constructed with each bin 1 dB in size. The histogram is then transformed into a sorted vector of linear amplitude elements in decreasing order. The sorted linear vector is then preferably reduced from the size MK to M by summing a group of K consecutive samples of the sorted vector. In this method M is typically much larger than K. A quasi log-likelihood function L(k) is then preferably applied on the sorted group of M elements. The negative of the quasi log-likelihood function is preferably added to a penalty polynomial function p(k) giving an expression of the form −L(k)+C p(k), where C is a constant, preferably empirically determined and most preferably near −2.6. The minimum of the −L(k)+C p(k) function is preferably selected where the index k of the minimum amplitude is denoted by $q_{NF}$. If a line is drawn on the histogram at the index $q_{NF}$, it can be seen that the received signal can be divided into 2 groups, the first being the message subspace, where the information contained in the non-noise signal exists, and the noise subspace, where the random noise values exist. Finally, the noise floor level estimate per frequency bin is preferably obtained by dividing by K the average M−$q_{NF}$−1 smallest values of the M sorted group. Thus the noise floor estimate per K frequency vin is the average value of the power along the dimensions of noise subspace.

The application where the proposed methods have been used is in spectrum monitoring of communication radio signals. The methods are particularly suitable where fast scanning operations are necessary and an adaptive threshold value is required. They can also be used to automate lengthy manual noise level measurement procedures, and the resulting noise floor level estimates can be used as an indication of the spectrum quality.

As stated earlier, it is an object of the invention to derive an estimate in real-time of the noise floor level in a wideband signal preferably without knowledge of the signal content in terms of carrier frequency, bandwidth, and power, and using only a short-time signal. In the preferred apparatus in accordance with the invention, the wideband signal, containing a plurality of narrowband signals, is preferably received from the analogue output of a radio receiver and sent to a digitizer where a block of output data is generated over a time period. The sampled amplitudes, though discrete, are real valued and thus the signal is still considered continuous in amplitude. The block of output data is then windowed in a windowing module and sent to a channelizer where the wideband signal is represented by a collection of complex amplitudes at several discrete frequencies. The amplitudes of the signals at the discrete frequencies are converted in a converter module to the log domain representation (decibels (dB) or decibel milliwatts (dBm)) and rounded to the nearest integer values. Thus the received signal is now represented by both discrete amplitude and frequency values.

BRIEF DESCRIPTION OF THE DRAWINGS

Exemplary embodiments of the invention will now be further described with references to the drawings in which same reference numerals designated similar parts throughout the figures thereof, and wherein.

DETAILED DESCRIPTION OF THE PREFERRED EMBODIMENT

In the context of spectrum monitoring, the input signal contains several channels that are observed by a wide-band channelisation receiver. The receiver requires knowledge of the noise floor, in order to set a threshold that will produce a constant detection false alarm rate, when the only assumption is an input signal with additive noise normally distributed. For simplicity and speed, the receiver must estimate the noise floor level from the current sampled information vector, which is provided by an analogue-to-digital (A/D) converter.

The time over which the input vector is sampled can vary depending upon the resolution required, the signal processing stages that follow and the physical constraints of moving the data to the subsequent stage. To ensure a fast scanning operation of the channelised receiver, it is important not to use more samples to extract the necessary information from the input vector for the noise floor level estimation process than the channelised receiver needs. The presence and parameters of these non-noise signals may not be known by the monitoring equipment. The a priori knowledge of the receiver is minimal and is limited to the information that signals are not wider than the sampling bandwidth.

Figure 1:
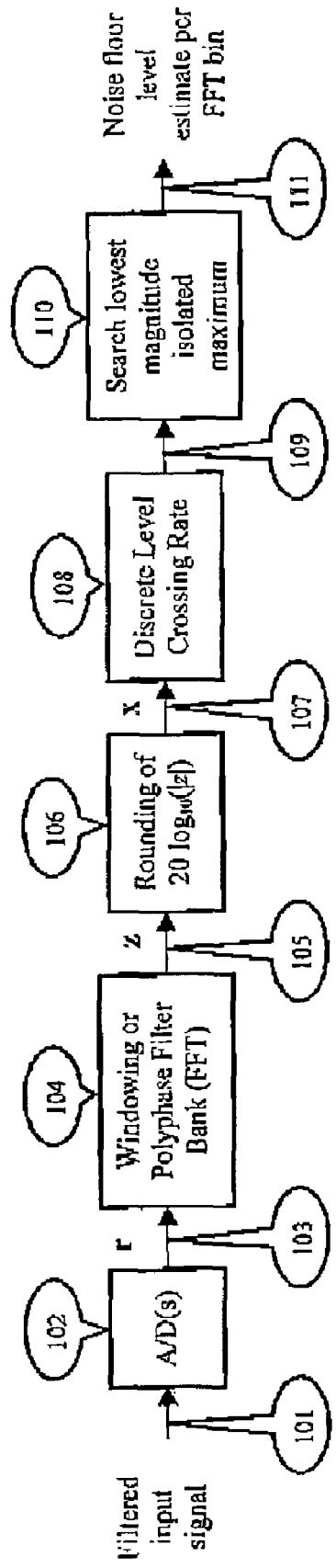
FIG. 1 is a block diagram of the signal processing elements for the discrete level crossing rate (DLCR) embodiment of the method according to the invention.

For a first embodiment of the present method, herein referred to as the Discrete Level Crossing Rate method, the signal path of the estimation method is presented in FIG. 1. The signal to be analyzed 101 has previously been filtered by methods known in the art to prevent aliasing of the frequency bands after the sampling process. The input analogue signal 101 contains additive noise emanating from various sources and non-noise signals. A plurality of analogue-to-digital converters 102 digitizes the signal and stores a series of samples in a buffer represented by the vector r 103. The vector r 103 is then windowed or polyphase filtered to produce another vector to be sent to a digital filter bank 104. The window choice may depend on specific requirements relative to a particular signal environment or on filter bank design criteria. It is also important that any gain in the signal path (noise and non-noise signals) up to the filter bank output be identified, cancelled or compensated, so that the output of the filter bank is representing the true signal power at the antenna input. It is therefore necessary to ensure that the equipment is properly calibrated to avoid any biased estimation of the noise floor level. In the digital domain, the filter bank is often implemented as a Fast Fourier Transform (FFT) to minimize computational complexity, but other transforms are also possible. The FFT is the preferred filter bank in this invention. The filter bank output represented by the vector z 105 is then transformed in a transforming module 106 to the integer log magnitude domain (dB or dBm) with a rounding operation on 20 times the logarithm base 10 of the magnitude of each complex point of the vector z. The implementation of the transformation step 106 is simplified by the rounding operation such that the precision required in the log computation can be small. The resulting vector x 107 is then processed by the Discrete Level Crossing Rate (DLRC) module 108. The analogue Level Crossing Rate (LCR) function is well known in the signal processing community where it is mainly used in wave propagation and communication channel modeling to obtain statistical information on the rate of change of fading processes on transmitted signals, and can be found in numerous standard texts including "Mobile Communications Engineering" W. C. Y. Lee, McGraw-Hill, 1982. The LCR is a second-order statistical operation that is time-dependent. It is usually sufficient to consider only the upward or the downward crossing in the evaluation of the function. The LCR is defined as the total number of expected crossings of the signal envelope, at a given amplitude A, per second. The standard LCR operates on time domain signals and is a continuous level function with a continuous signal at the input. The current signal has a discrete-frequency discrete-amplitude representation. To overcome this difficulty, the solution is to use a discrete amplitude version of the LCR in the form of a histogram containing the number of times a discrete decibel amplitude value is crossed in the upward direction. Therefore, with discrete-frequency signals, an approximation to the true LCR is built as a histogram of the number of occurrences of the positive crossing (positive slope) of an integer amplitude value in dB. For an additive Gaussian noise only signal, this procedure produces a function having a shape of the form.

$$n[Z=A] = \frac{\sqrt{2}\rho 10^{\frac{A}{10}}}{40\sqrt{\pi}\,\sigma^2 \log_{10}(e)} \exp\left(-\frac{10^{\frac{A}{10}}}{\sigma^2}\right),$$

where A is the integer level in dB at which the number of crossing is required, $\rho$ is a correlation parameter of the frequency levels, and $\sigma^2$ is the variance of the additive complex Gaussian noise process in an FFT bin. The function above has a single maximum that can easily be verified to be located at $10 \log_{10}(\sigma^2)$. The parameter to estimate is the value of $\sigma^2$ and it can be estimated with the position of the maximum of the function n[A] when only noise is present.

The situation where one or several non-noise signals are present with the additive noise needs additional signal processing. For this case, it is possible that the maximum of the function is not the noise floor level since the signal might cross a given amplitude more often if the observation bandwidth is highly occupied with non-noise signals. To avoid potentially large bias errors, the first local maximum, starting from the lowest dB values, is selected. To check if this local maximum is not due to a random fluctuation in the construction of a given discrete LCR histogram, it is then verified that there is no greater histogram value on the right side of the local maximum closer to Y dB relative to the current local maximum. This verification also stabilizes the method by preventing large overestimates of the noise floor level when the channel occupancy is high. The search for the appropriate maximum performed in search module 110, on the output of the Discrete Level Crossing Rate module 108, which is referred to as 109, can have different forms. The value of Y depends on the dynamic range of the non-noise signals. For this application, a value of 3 dB is used. Other mechanisms to stabilize the method in presence of high occupancy narrowband signals are possible. The abscise value of the maximum, found in search module 110 is the noise floor level estimate 111 per FFT bin within an offset. The offset to be added to the abscise value depends on the window or the polyphase filter used. Table 1 gives the offset for four popular windows. Thus the noise floor level estimate $\hat{\sigma}^2$ per FFT bin in dB is $\hat{\sigma}^2$ [dB]=position of appropriate maximum [dB]+ Offset [dB].

The noise floor level estimates $\hat{\sigma}^2$ can be average for the same frequency band to reduce the variance if the noise floor level is known to vary very slowly.

To evaluate the performance of this method, simulation software was employed and a real-time implementation was developed to gather statistics about the noise floor level estimates. The performance in terms of the bias and the variance of the noise floor level estimate of the invented method was presented as a function of the channel occupancy, and as a function of the information signal power for a scenario of a specific non-noise signal. A sampled FM signal in the 139 to 144 MHz band was used as the transmitted signal in the simulation software. The channel bandwidth was set to 30 kHz and the windowed FFT filter bank used a Blackman window. The transmitted signals all have the same average power at the receiver input.

Figure 2:
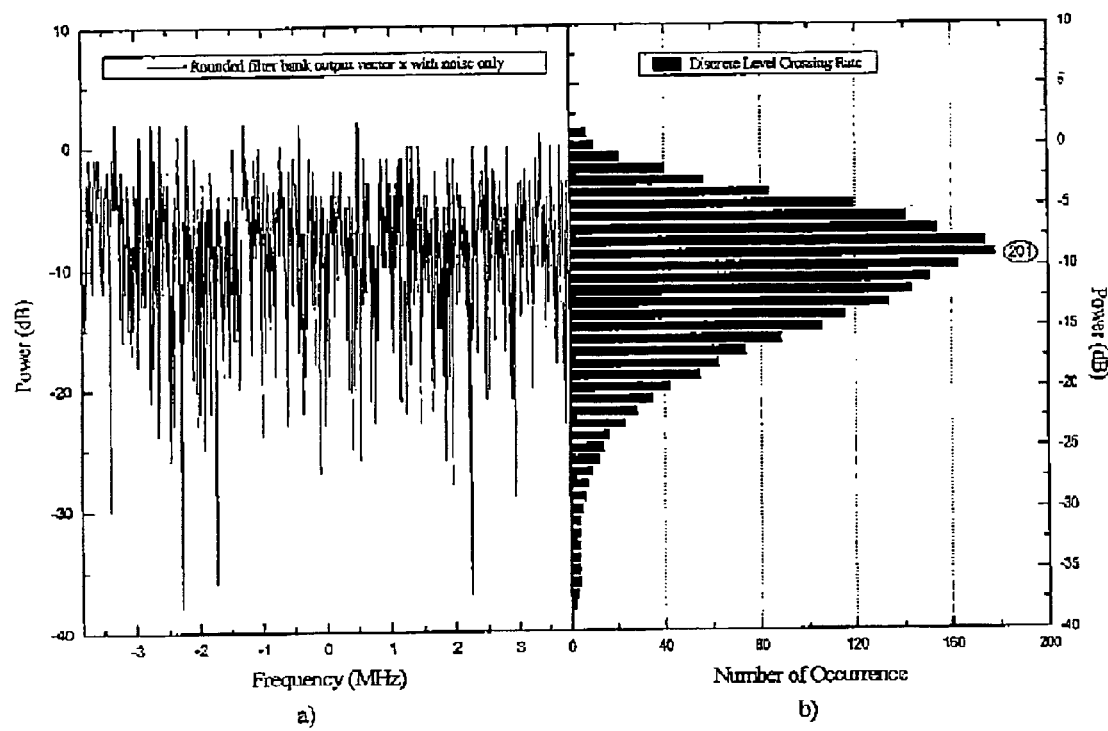
FIG. 2 is an example of the discrete level crossing rate with a noise only input signal.
Figure 3:
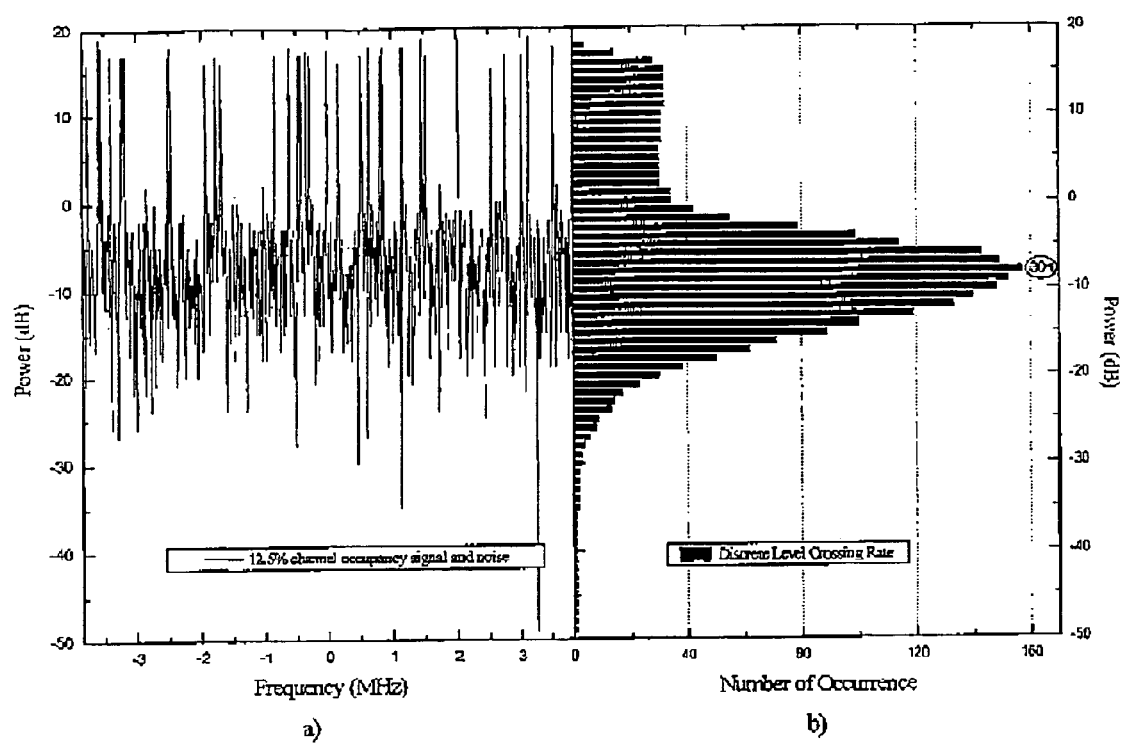
FIG. 3 is an example of the discrete level crossing rate with both noise and non-noise signals at the receiver's input
Figure 4:
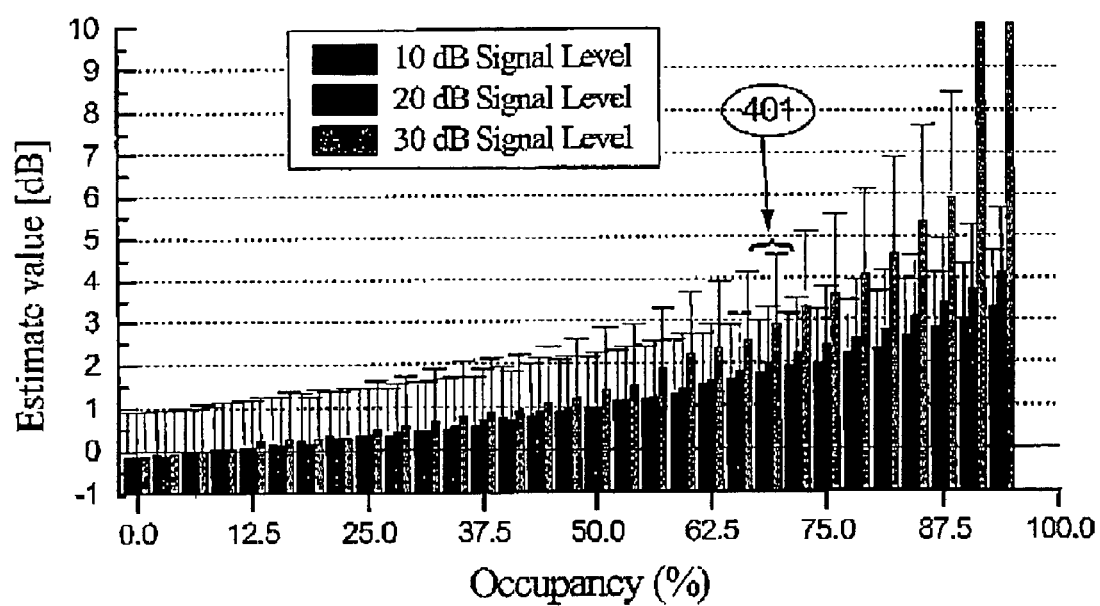
FIG. 4 is an example of the behaviour of the DLCR method as a function of the occupancy.
Figure 5:
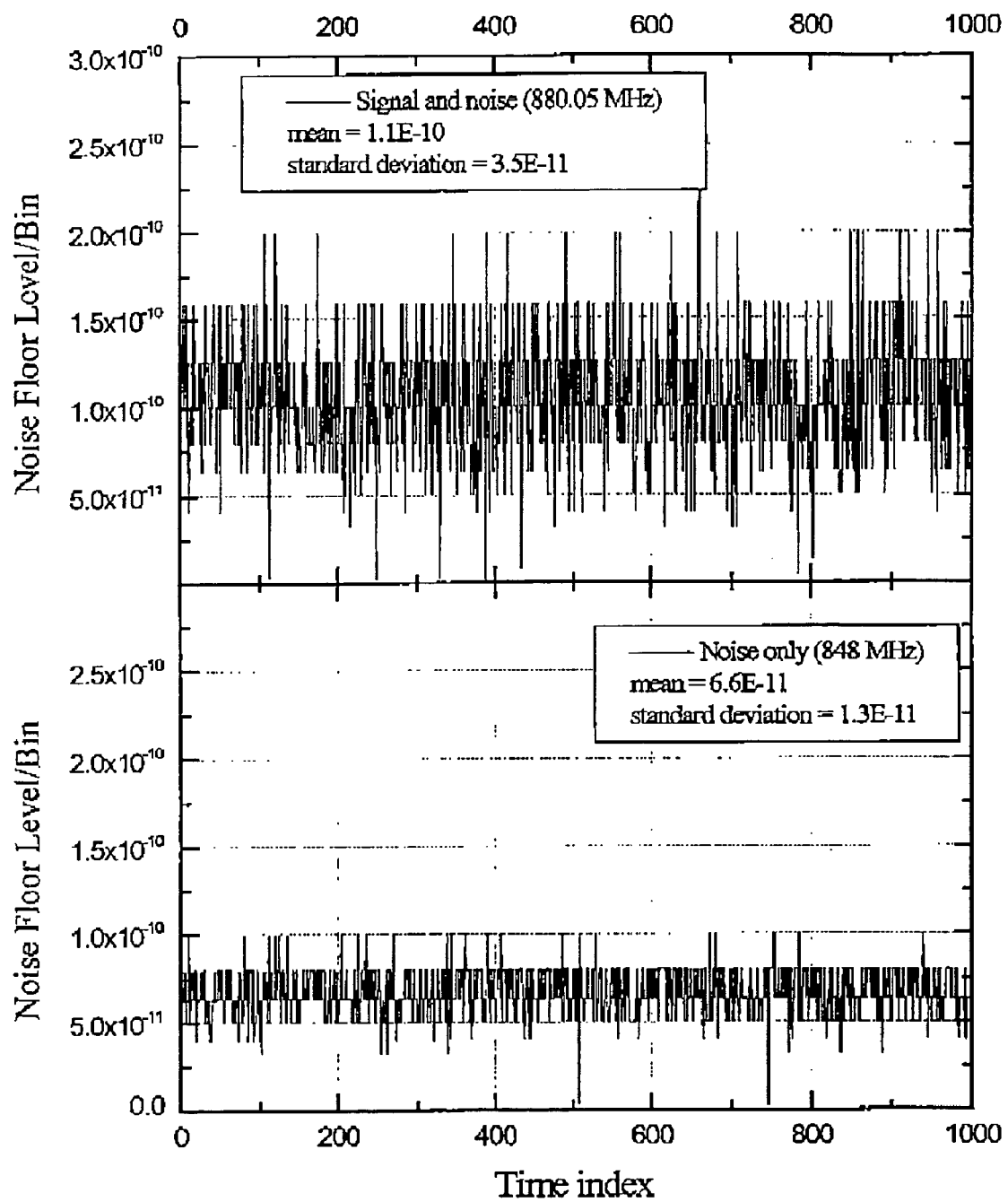
FIG. 5 is an example of experimental results showing the time behaviour with low and high signal frequency band occupancy for the DLCR method in the 800 MHz band.

FIG. 2 demonstrates the construction of the DLCR histogram for a particular vector x when only a noise signal is present in the simulation data at the input. In FIG. 2a, a Blackman window is used with 1024 filter bank outputs rounded to their nearest integer values. The resulting DLCR is presented in FIG. 2b where the maximum 201 of the histogram is at −9 dB. Adding the 3 dB offset gives a noise floor level per FFT bin of −6 dB, the true value. FIG. 3 demonstrates the construction of the DLCR histogram for a particular vector x when a composite signal having a channel occupancy of 12.5% with K=4 bins per channel is present with the noise signal in the simulation data at the input of the A/D. The signals have a signal power 20 dB above the noise floor level. In FIG. 3a, a Blackman window is used with 1024 filter bank outputs rounded to their nearest integer values. The resulting DLCR is presented in FIG. 3b where the maximum of the histogram is now at −8 dB 301. With the 3 dB offset, the noise floor level per FFT bin is of −5 dB. A bias of 1 dB is introduced in this example. In general, the algorithm will introduce a small bias as a function of the narrowband non-noise signal spectrum shape, the signal amplitude and more importantly the channel occupancy. In the following, the number of channels M has been fixed to 64 and the number of bins per channel K to 8. These numbers are typical of what is expected in practice. Other choices of number of channels and number of bins per channel are possible with different performance results. FIG. 4 illustrates the performances for the values of signal-to-noise ratios of 10, 20, and 30 dB in 30 kHz with the true value of the noise floor level being at 0 dB. Each column bar is the average of 1000 independent estimates with an error bar for the standard deviation. FIG. 4 shows that the estimate bias is increasing with the channel occupancy. It is within 3 dB of the true value up to 68.75% of channel occupancy 401. FIG. 5 presents the real-time signals. The signal of interest was over a 4.5 MHz bandwidth sampled at 5.12 MHz with 5 kHz bin resolution. The size of the vector r is thus 1024. Two curves are presented: one where the centre frequency was at 848 MHz with a low occupancy of approximately 3%, and one where the centre frequency is 880.05 MHz where the occupancy is about 54% with an average signal power of 30 dB above the noise floor level. Since the two bands are very close to each other, it is assumed that the noise floor levels of both are the same. The algorithm shows a bias of about 2.2 dB for an occupancy level of 54% relative to the low channel occupancy band. The variance also increases when the occupancy increases. In this particular case, the variance is tripled. The performance of the method of the invention is thus very good considering that no a priori knowledge of the signals is available to the receiver.

Figure 6:
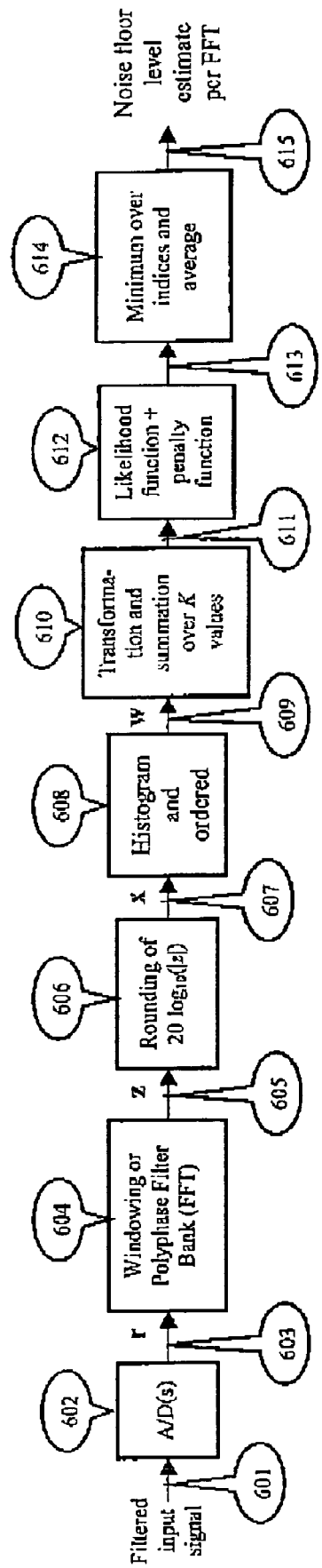
FIG. 6 is a block diagram of the signal processing elements for the penalized quasi log-likelihood (PLLM) embodiment of the method according to the invention.

Another embodiment of the noise floor level estimation method of the invention is the method presented in FIG. 6, which is referred to herein as the penalized log-likelihood method. The first seven steps of the method (601, 602, 603, 604, 605, 606, 607) are the same as the first seven steps (101, 102, 103, 104, 105, 106, 107) of the DLCR method of the embodiment presented in FIG. 1. Thus, the received signal 601 to be analyzed is assumed to have been filtered to prevent aliasing of the frequency bands after the sampling process. A plurality of analogue-to-digital converters 602 digitizes the signal and stores a series of samples in a buffer represented by the vector r 603. The vector r is then windowed or polyphase filtered before being applied to a filter bank 604. It is also important that any gain in the signal path (noise and non-noise signals) up to the filter bank output be cancelled or compensated, so that the output of the filter bank is representing the true signal power at the antenna input. It is therefore necessary to ensure that the equipment is properly calibrated to avoid any biased estimation of the noise floor level. In the digital domain, the filter bank is often implemented as a Fast Fourier Transform (FFT) because of its computational efficiency. The filter bank output represented by the vector z 605 is then converted to the integer log magnitude domain 606 with a rounding operation on the product of 20 times the logarithm base 10 of the magnitude of each complex point of the vector z 605. Here again, a requirement is that the noise power level be determined from a single FFT trace. The rounded dB values in the vector x 607 are then used to build a standard histogram 608 with histogram bins corresponding to the integer dB values. The histogram computed is then used to build an ordered sequence 608 of amplitude dB values in decreasing order w 609. The vector w is then of the same length and contains the same elements are the vector x but with elements in decreasing order. Thus, the block of histogram and the decreasing ordered sequence 608 is equivalent to a decreasing sort operation on the rounded dB values. The present approach is much less complex in terms of number of operations required to perform the sorting than a true sorting method. The decreasing sorted integer dB values are then transformed back to the linear domain 610 with the transformation $$v_i = 10^{w_i/10}$$

for each of the elements in the vector w 609. The decreasing sorted linear values are then summed by groups of K 610 starting with the largest values. This grouped reduces the dimension of the problem from MK to M. Another impact of the growing operation is the tendency of the group sample power to be de-correlated even with the use of a window 604, because the decreasing ordered samples are not necessary from adjacent FFT bins. The following block 612 is the computation of the penalized quasi-log-likelihood function with the expression $$\text{PLLM}(k) = -L(k) + Cp(k), k = 0, 1, \ldots, M-1,$$

where L(k) is a quasi log-likelihood function of the M sorted group elements, C is a constant and p(k) is a penalty function. In this embodiment, the quasi-log-likelihood function is given by $$L(k) = K \ln \left[ \frac{\prod_{i=k+1}^{M} l_i}{\left( \frac{1}{M-k} \sum_{i=k+1}^{M} l_i \right)^{M-k}} \right], k = 0, 1, \ldots, M-1,$$

where $l_i$ are the M decreasing values of the power in the grouped K bins 611, though it should be noted that a variety of log-likelihood, and quasi-log-likelihood functions could provide acceptable results. The function L(k) would be a true log-likelihood function if $l_i$ were the variance of independent and zero mean Gaussian random variables, but the elements of a received signal are correlated and thus are not independent nor are they necessarily zero mean Gaussian random variables. The penalty function p(k) is added to the negative of the quasi log-likelihood function to form the function PLLM(k) over which the minimum will be searched 614. The penalty function p(k) is often related to an Information Theoretic Criteria as described in "Detection of Signals by Information Theoretic Criteria" M. Wax and T. Kailath, IEEE Transactions Acoustic, Speech, Signal Processing volume 33, number 2, pages 387-392, April 1985. The penalty function in this embodiment, however, is different from those derived earlier in that the coefficients $l_i$ are not truly statistically independent, and that the intent is not to determine the full model order as in the reference cited above. For this embodiment, the penalty function is a second order polynomial given by $$p(k) = C \left[ 3.76 \left( \frac{M-1-k}{M-1} \right)^2 + 1.43 \left( \frac{M-1-k}{M-1} \right) \right] MK.$$

Other polynomials or functions are possible, but this second order polynomial is adequate for a good performance and complexity trade off. The polynomial function is sealed by a constant C to avoid erroneous detection due to the variance in the data. The value of C has been determined empirically and may vary depending on the final goal of the design or the signal environment at the input. For this application, C=−2.6 is the preferred value. The only assumption to determine the above polynomial is that the FFT coefficients are distributed according to a Gaussian probability density function. If the additive noise time data samples do not have a Gaussian distribution the linear combination of the FFT will tend to transform them into variables having a probability distribution close to Gaussian variables for practical and large size of MK. The method is therefore robust to non-ideal conditions where the additive noise might not be truly Gaussian. The scale factor C gives a degree of freedom in the optimization process. The output of function PLLM(k) is then searched in step 614 for the index of its minimum $q_{NF}$ defined as $$q_{NF} = \arg\min_{k} \{-L(k) + Cp(k)\}.$$

The above expression means that $q_{NF}$ is the index at the minimum of the function PLLM(k). The noise floor estimate per K FFT bins is the average of the $M - q_{NF} - 1$ smallest numbers of the sorted vector values $l_i$. The noise floor estimate 615 per FFT bin is then given by $$\hat{\sigma}^2 = \frac{1}{K(M - q_{NF} - 1)} \sum_{i=\hat{q}_{NF}+1}^{M-1} l_i.$$

The noise floor level estimates $\hat{\sigma}^3$ can be averaged for the same frequency band to reduce the variance if the noise floor level is known to vary very slowly.

To evaluate the performance of the PLLM algorithm, simulation software was employed and a real-time implementation was developed to gather statistics about the noise floor level estimates. The performance in terms of the bias and the variance of the noise floor level estimate of the invented method is presented as a function of the channel occupancy and as a function of the information signal power for a scenario of a specific signal. A sampled FM signal in the 139 to 144 MHz band is used as the transmitted signal in the simulation software. The channel bandwidth is set to 30 kHz and the windowed FFT filter bank used a Blackman window. The transmitted signals all have the same average power at the receiver input.

Figure 7:
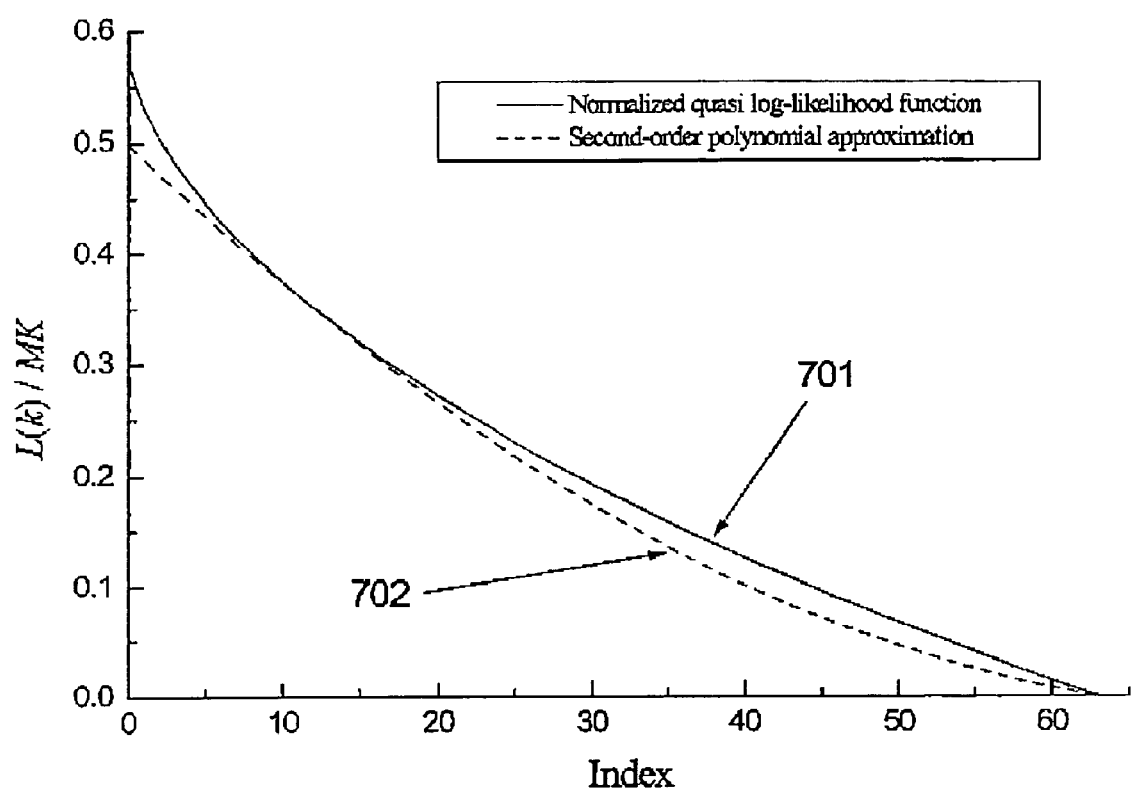
FIG. 7 is a plot of the quasi log-likelihood function and the associated penalizing polynomial.
Figure 8:
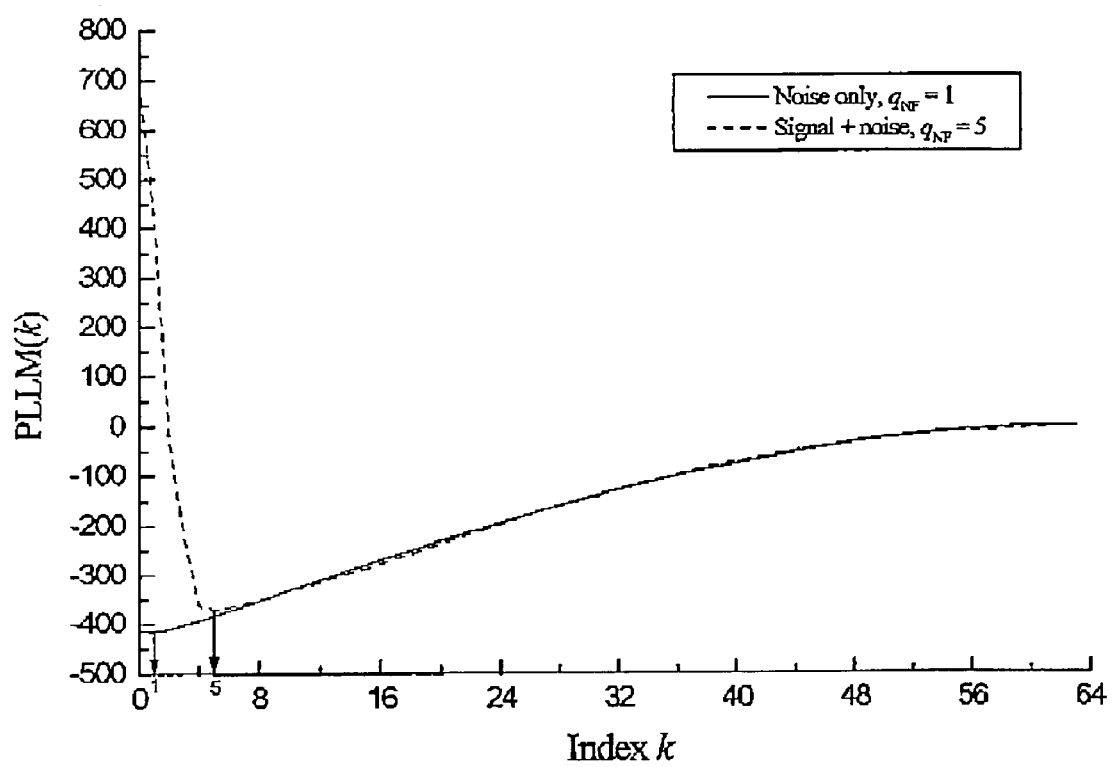
FIG. 8 is an example of the PLLM(k) function for a noise only signal, and a non-noise with noise signal.
Figure 9:
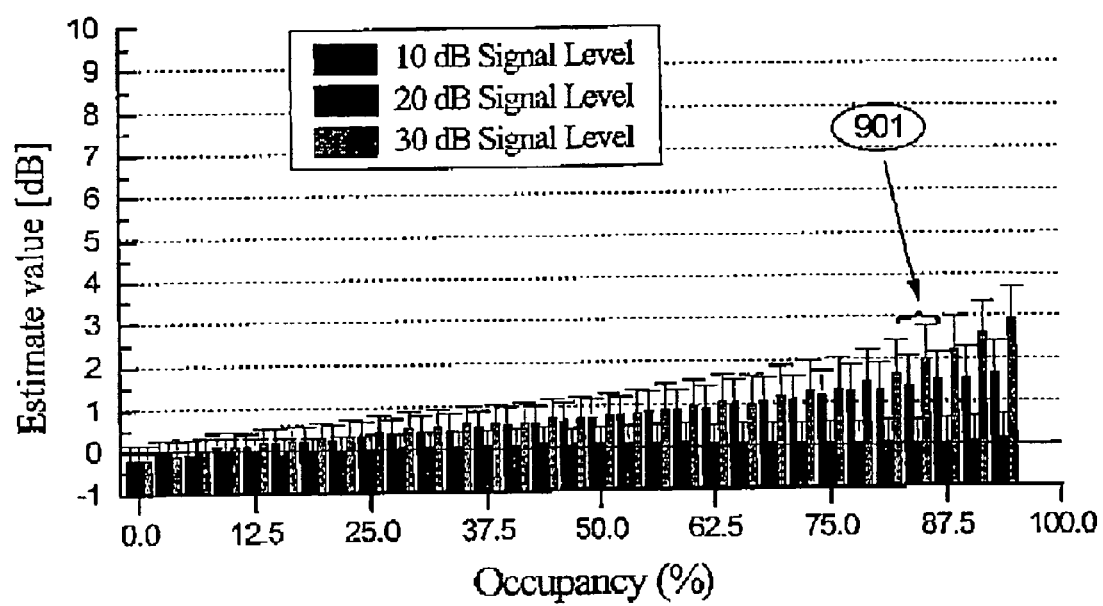
FIG. 9 is an example of the behaviour of the PLLM method as a function of the frequency band occupancy.
Figure 10:
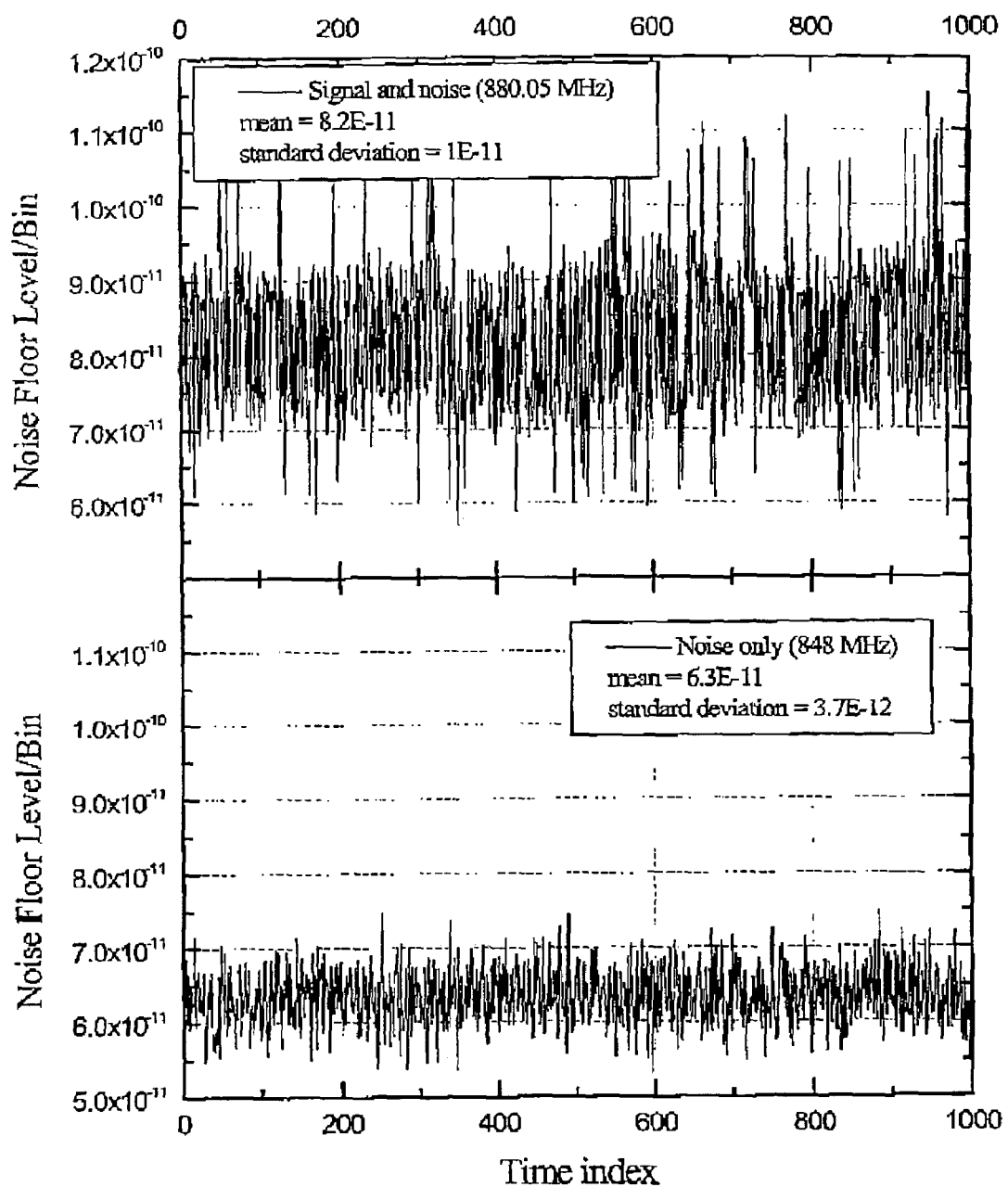
FIG. 10 is an example of experimental results showing the time behaviour with low and high signal occupancy for the PLLM method in the 800 MHz band; and Table 1 shows the offset for the DLCR method.

FIG. 7 illustrates the normalized quasi log-likelihood function 701 and the second-order polynomial approximation 702 with the scale factor C=1 for a Gaussian noise only input signal. As the figure shows, the two curves are similar over the range of the index k. FIG. 8 presents the PLLM(k) function for a noise only, and a non-noise plus noise signal. It can be seen that the index of the minimum of the PLLM(k)

function is indicative of the signal subspace dimension. Since the remaining subspace includes noise only components, then the average is an estimate of the noise floor level. In the following, to reduce the amount of simulation results to present, the number of channels M has been fixed to 64 and the number of bins per channel K to 8. These numbers are typical of what is expected in practice. Other choices of number of channels and number of bins per channel are possible with different performance results. FIG. 9 illustrates the performances for the values of signal-to-noise ratios of 10, 20, and 30 kHz with the true value of the noise floor level being at 0 dB. Each column bar is the average of 1000 independent estimates with an error bar representing the standard deviation. FIG. 9 shows that the estimate bias increases with the channel occupancy. The estimate is within 2 dB of the true value up to 84.375% of channel occupancy 901. FIG. 10 presents real-time implementation results where 1000 estimates of the noise floor level were computed using real-life signals. The signal of interest was over a 4.5 MHz bandwidth sampled at 5.12 MHz with 5 kHz bin resolution. Two curves are presented: one where the centre frequency was at 848 MHz with a low occupancy of approximately 3%, and one where the centre frequency is 880.05 MHz where the occupancy is about 54% with an average signal power of 30 dB above the noise floor level. Since the two bands are very close to each other, it is assumed that the noise floor levels of both are the same. The algorithm shows a bias of about 1.15 dB for an occupancy level of 54% relative to the low channel occupancy band. The variance also increases when the occupancy increases. In this particular case, the variance is almost tripled. The performance method is thus very good considering that no a priori knowledge of the signals is available.

The exemplary embodiments described above are provided for the sake of clarification and are not intended to limit the scope of the invention. Of course, numerous variations and adaptations may be made to the above-described embodiments of the invention, without departing from the spirit of the invention, which is defined in the claims.

Changes and modifications in the specifically described embodiments can be carried out without departing from the scope of the invention which is intended to be limited only by the scope of the appended claims.

TABLE 1

| Window | Offset (dB) |
| --- | --- |
| Rectangular | 2 |
| Hanning | 2.75 |
| Blackman | 3 |
| Flat-top | 3.2 |

What is claimed is:

1. A method of estimating the noise floor of a continuous wideband analogue signal comprising the steps:
    a. representing the continuous wideband analogue signal as a series of discrete frequency and amplitude values;
    b. creating a histogram based on the discrete frequency and amplitude values by;
        establishing a lowest bin representing the lowest integer value of the discrete series representing the wideband signal,
        establishing a highest bin representing the highest integer value of the discrete series representing the wideband signal,
        establishing bins for each integer value between the lowest and highest bins, and
        incrementing the value of at least one bin when there is an upward or downward crossing of the bin by at least one segment of the series representing the wideband signal; and
    c. deriving a noise floor estimate from characteristics of the histogram.

2. The noise floor estimation method of claim 1 wherein the step of representing the continuous signal includes the steps of:
    a. sampling the received wideband signal using a plurality of analogue-to-digital converters to generate a series of output signals;
    b. windowing the output signals of the analogue-to-digital converters;
    c. applying a mathematical transform to the results of the windowing to obtain a series of discrete frequency values;
    d. converting the amplitude of each discrete frequency value to log-domain representation; and
    e. rounding the log-domain representation of the amplitude of each discrete frequency value to the nearest integer value to generate a discrete amplitude value.

3. The noise floor estimation method of claim 2 wherein the step of windowing includes the steps of:
    a. selecting a discrete valued weighting function;
    b. multiplying the value of each output signal of the series by a corresponding element of the discrete weighting function.

4. The noise floor estimation method of claim 2 wherein the mathematical transform is a discrete Fourier Transform.

5. The noise floor estimation method of claim 2 wherein the step of converting the amplitude to log domain representation includes multiplying 20 by the base 10 logarithm of the magnitude of the amplitude.

6. The noise floor estimation method of claim 2 wherein the log domain representation of the amplitudes results in the amplitudes being expressed as decibel (dB) values.

7. The noise floor estimation method of claim 2 wherein the log domain representation of the amplitudes results in the amplitudes being expressed as decibel milliwatt (dBm) values.

8. The noise floor estimation method of claim 1 wherein the step of deriving the noise floor estimate from the characteristics of the histogram includes the steps of:
    a. defining the lowest dB bin as a starting point
    b. determining the next lowest valued local maximum on the histogram;
    c. performing a Y test on the determined maximum;
    d. repeating steps b and c until the Y test fails;
    e. setting the noise floor by adding an offset to the dB value of the maximum of the histogram that caused the Y test failure.

9. The noise floor estimation method of claim 8 wherein performing the Y test includes the steps of:
    examining all points in the next Y dB;
    considering the test a pass when a point exists in the next Y dB which has a higher value than the starting point;
    considering the test a fail when no point exists in the next Y dB which has a higher value than the starting point.

10. The noise floor estimation method of claim 9, wherein Y is 3 dB.

11. The noise floor estimation method of claim 8, wherein the offset is determined based on observed characteristics of the signal and the windowing process' discrete weighting function.

12. The noise floor estimation method of claim 11, wherein the offset is selected from the group of 2 dB for a rectangular window, 2.75 dB for a Hanning window, 3 dB for a Blackman window, and 3.2 dB for a flat top window.

13. A method of estimating the noise floor of a continuous wideband analogue signal comprising steps of:
   a. representing the continuous wideband analogue signal as a series of discrete frequency and amplitude values;
   b. creating a histogram based on the discrete frequency and amplitude values by;
      establishing a lowest bin representing the lowest integer dB value of the discrete series representing the wideband signal;
      establishing a highest bin representing the highest integer dB value of the discrete series representing the wideband signal;
      establishing bins for each integer dB value between the lowest and highest bins so that there are a total of MK bins;
      incrementing the bins for each time an element in the discrete series falls into the bin; and
   deriving a noise floor estimate from characteristics of the histogram.

14. The noise floor estimation method of claim 13, wherein the step of deriving the noise floor estimate from the characteristics of the histogram includes the steps of:
   a. sorting the elements of the histogram in decreasing order of amplitude to create a sorted vector;
   b. reducing the size of the sorted linear vector from MK to M by summing groups of K consecutive elements of the sorted linear vector for achieving a more discretised amplitude representation;
   c. applying one of a log-likelihood function, and a quasi log-likelihood function, to the M elements of the sorted linear vector to achieve a discrete function L(k);
   d. subtracting L(k) from a multiple (C) of a discrete penalty function p(k) to obtain the function $-L(k)+C\,p(k)$;
   e. identifying the index, denoted by $q_{NF}$, at which the minimum of the $-L(k)+C\,p(k)$ equation is achieved; and
   f. computing the noise floor level estimate per bin by dividing the mean of the $M-q_{NF}-1$ smallest values of the M sorted vector by K.

15. The noise floor estimation method of claim 14, wherein M is considerably larger than K.

16. The noise floor estimation method of claim 15, wherein M=64.

17. The noise floor estimation method of claim 15, wherein K=8.

18. The noise floor estimation method of claim 14 wherein L(k) is represented by the quasi-log-likelihood function $$L(k) = K \ln \left[ \frac{\prod_{i=k+1}^{M} l_i}{\left( \frac{1}{M-k} \sum_{i=k+1}^{M} l_i \right)^{M-k}} \right],$$

where k is the index of the function.

19. The noise floor estimation method of claim 14, wherein the penalty function is a polynomial.

20. The noise floor estimation method of claim 14, wherein the penalty function is represented by the second order polynomial function $$p(k) = \left[ 3.76 \left( \frac{M-1-k}{M-1} \right)^2 + 1.43 \left( \frac{M-1-k}{M-1} \right) \right] MK.$$

21. The noise floor estimation method of claim 14, wherein the constant C is -2.6.

22. A wideband analogue signal noise floor estimation apparatus comprising:
   a digitizer module for creating a discrete series representation of a continuous wide band analogue signal, the representation comprised of discrete frequency and amplitude values;
   b. a histogram module for generating a histogram based on the discrete frequency and amplitude values, the histogram module including
      a low bin establishing element for creating a low valued bin to represent the integer value of lowest valued element in the discrete series representing the wideband signal,
      a high bin establishing element for creating a high valued bin to represent the integer value of the highest valued element in the discrete series representing the wideband signal,
      a tertiary bin creation element for creating bins for each integer value between the lowest and highest bins, and
      a bin count incrementing element for incrementing a value of a bin when there is an upward or downward crossing of the bin by at least a segment of the discrete series; and
   c. an estimation module for deriving an estimate of the noise floor of the wideband signal based on the characteristics of the histogram.

23. The noise floor estimation apparatus of claim 22, wherein the digitizer module further comprises:
   a. a sampling module including a plurality of analogue-to-digital converters for generating a series of output signals;
   b. a windowing module for weighting the output signals of the sampling element to generate weighted output signals;
   c. a transforming module for applying a mathematical transform to the weighted output signals to create a signal comprised of discrete frequency values that represent the original signal;
   d. an amplitude domain converter for converting the linear amplitude values to log-domain representation; and
   e. an amplitude discretizing module for representing the output of the amplitude domain conversion element as a sequence of integer valued amplitude levels.

24. The noise floor estimation apparatus of claim 23, wherein the windowing module further includes a weighting element for multiplying each value of the output series by a corresponding element of a preselected discrete valued weighting function.

25. The noise floor estimation apparatus of claim 23, wherein the transforming module applies a Fast Fourier Transform.

26. The noise floor estimation apparatus of claim 23, wherein the amplitude discretizing module is constructed to convert each amplitude value of the discrete frequency series to 20 times base 10 logarithm of the magnitude of the value.

27. The noise floor estimation apparatus of claim 23, wherein the amplitude domain converter outputs amplitude values as decibel (dB) values.

28. The noise floor estimation apparatus of claim 23, wherein the amplitude domain converter outputs amplitude values as decibel milliwatt (dBm) values.

29. The noise floor estimation apparatus of claim 22, wherein the estimation module further includes:
   a. a maxima finding element for finding the next left most maximum from a given starting point, that in the absence of previous data takes the lowest dB bin as a starting point;
   b. a Y test element for performing a Y test;
   c. a decision element for calling upon the maxima finding element until the Y test element reports a fail; and
   d. a noise floor setting element for providing a noise floor estimate by adding an offset to the dB value reported by the maxima finding element that caused the Y test element to report a fail.

30. The noise floor estimation apparatus of claim 29, wherein the Y test element further includes:
   a. an examination element for searching the Y dB to the right of the given starting point for a value higher than the starting point; and
   b. a reporting element for reporting a fail when no point exists in the next Y dB that has a higher value than the starting point and reports a pass if there is a value in the next Y dB that is greater in value than the starting point.

31. The noise floor estimation apparatus of claim 30, wherein Y is set at 3 dB.

32. The noise floor estimation apparatus of claim 29, wherein the offset used by the noise floor setting element is based on observed characteristics of the signal and the windowing process' discrete weighting function.

33. The noise floor estimation apparatus of claim 32, wherein the offset is selected from the group of 2 dB for a rectangular window, 2.75 dB for a Hanning window, 3 dB for a Blackman window, and 3.2 dB for a flat top window.

34. The noise floor estimation apparatus of claim 22, wherein the estimation module further includes:
   a. a sorting element for creating a vector containing the discrete amplitudes of the input signal in decreasing order;
   b. a vector size reducing element for reducing the size of the sorted linear vector from MK elements to M elements by summing groups of K consecutive elements of the sorted linear vector to achieve a more discretised amplitude representation;
   c. a log-likelihood element for applying a log-likelihood, or a quasi log-likelihood function, to the M elements of the sorted linear vector output from the vector reducing element to achieve a discrete function L(k);
   d. a penalty function element for subtracting the discrete function L(k) from a multiple (C) of a discrete penalty function p(k) to obtain the function −L(k)+C p(k) (PLLM function);
   e. an index identification element for identifying the index at which the minimum of the PLLM function, −L(k)+C p(k), is achieved and identifying the index, denoted by $q_{NF}$, at which the minimum of the −L(k)+C p(k) equation is achieved; and
   f. a noise floor setting element for providing a noise floor estimate by dividing the mean of the M−$q_{NF}$−1 smallest values of the M sorted vector by K.

35. The noise floor estimation apparatus of claim 34, wherein the penalty function element is constructed to apply a polynomial as the penalty function.

36. The noise floor estimation apparatus of claim 34, wherein the penalty function element is constructed to apply the second order polynomial function $$p(k) = \left[3.76\left(\frac{M-1-k}{M-1}\right)^2 + 1.43\left(\frac{M-1-k}{M-1}\right)\right]MK$$

as the penalty function.

37. A wideband analogue signal noise floor estimation apparatus comprising:
   a digitizer module for creating a discrete series representation of a continuous wide band analogue signal, the representation comprised of discrete frequency and amplitude values;
   b. a histogram module for generating a histogram based on the discrete frequency and amplitude values, the histogram module including
      a low bin establishing element for creating a low valued bin to represent the lowest integer dB values of the discrete series representing the wideband signal,
      a high bin establishing element for creating a high valued bin to represent the highest integer dB value of the discrete series representing the wideband signal,
      a tertiary bin creation element for creating bins for each integer dB value between the lowest and highest bins, and
      a bin count incrementing element for incrementing a value of a bin for each time an element in the discrete series falls into the bin.

* * * * *